(12) United States Patent
Brown et al.

(10) Patent No.: US 6,459,133 B1
(45) Date of Patent: Oct. 1, 2002

(54) ENHANCED FLUX SEMICONDUCTOR DEVICE WITH MESA AND METHOD OF MANUFACTURING SAME

(75) Inventors: Adam R. Brown, Bramhall (GB); Godefridus A. M. Hurkx, Eindhoven (NL); Wiebe B. De Boer, Eindhoven (NL); Hendrik G. A. Huizing, Eindhoven (NL); Eddie Huang, Fallowfield (GB)

(73) Assignee: Koninklijke Phillips Electronics N.V., Eindhoven (NL)

( * ) Notice: Subject to any disclaimer, the term of this patent is extended or adjusted under 35 U.S.C. 154(b) by 0 days.

(21) Appl. No.: 09/545,782

(22) Filed: Apr. 7, 2000

(30) Foreign Application Priority Data

Apr. 8, 1999 (EP) .............................................. 99302762

(51) Int. Cl.[7] ......................... H01L 23/58; H01L 23/68; H01L 29/06
(52) U.S. Cl. ........................ 257/497; 257/498; 257/361; 257/362; 257/618
(58) Field of Search ................................. 257/361, 362, 257/497, 498, 280–282, 618

(56) References Cited

U.S. PATENT DOCUMENTS

| | | | | |
|---|---|---|---|---|
| 3,849,789 A | * | 11/1974 | Cordes et al. | ............... 257/475 |
| 4,876,580 A | * | 10/1989 | Nishizawa | ............... 257/497 |
| 6,121,633 A | * | 9/2000 | Singh et al. | ................... 257/77 |

FOREIGN PATENT DOCUMENTS

| | | | | |
|---|---|---|---|---|
| JP | 406061478 | * | 3/1994 | ................. 257/498 |

OTHER PUBLICATIONS

"Punchthrough Transient Voltage Suppressor for EOS/ESD Protection of Low–Voltage IC's", by Bin Yu, et al., EOS/ESD Symposium 1995, pp. 1.4.1–1.4.7.

* cited by examiner

*Primary Examiner*—Eddie Lee
*Assistant Examiner*—Jesse A. Fenty
(74) *Attorney, Agent, or Firm*—Steven R. Biren

(57) ABSTRACT

The invention relates to a so-called punch-through diode with a mesa (12) comprising, in succession, a first (1), a second (2) and a third (3) semiconductor region (1) of, respectively, a first, a second and the first conductivity type, which punch-through diode is provided with two connection conductors (5, 6). During operation of said diode, a voltage is applied such that the second semiconductor region (2) is fully depleted. A drawback of the known punch-through diode resides in that the current flow is too large at lower voltages. In a punch-through diode according to the invention, a part (2A, 2B) of the second semiconductor region (2), which, viewed in projection, borders on the edge of the mesa (12), is provided with a larger flux of doping atoms of the second conductivity type than the remainder (2A) of the second semiconductor region (2). It has been found that the high current at a low voltage of the known diode is caused by the fact that the second semiconductor region (2) at the edge of the mesa (12) is depleted before the remainder of the second semiconductor region (2). By locally increasing the flux of doping atoms, the depletion at the edge is delayed as compared to the remainder of the second semiconductor region. Preferably, this result is obtained by locally increasing the thickness of the second semiconductor region (2). In this manner, a substantial current reduction at lower voltages is obtained in the diode in accordance with the invention.

13 Claims, 2 Drawing Sheets

ENHANCED FLUX SEMICONDUCTOR DEVICE WITH MESA AND METHOD OF MANUFACTURING SAME

BACKGROUND OF THE INVENTION

The invention relates to a semiconductor device comprising a semiconductor body which includes a substrate and is provided with a mesa, said semiconductor body comprising, in succession, a first semiconductor region of a first conductivity type, a second semiconductor region of a second conductivity type, opposite to the first conductivity type, and a third semiconductor region of the first conductivity type, the first and the third semiconductor regions being provided with an electrical connection conductor across which, during operation, an electric voltage is applied, and the thickness and the doping concentration of the second semiconductor region being chosen such that, during operation, the second semiconductor region is fully depleted. Such a device, which is also referred to as a "punch-through" diode, is used, for example, as a power diode or a so-called Transient Voltage Suppressor or as a so-called camel diode. If such a diode is used as a power or camel diode, its barrier is preferably as low as possible in view of the use of such a diode at a (very) high current density. The invention also relates to a method of manufacturing such a device.

Such a diode is known from the article "Punchthrough Transient Voltage Suppressor for EOS/ESD Protection of Low-Voltage ICs" by Bin Yu et. al., which was published in 1995 in Proceedings EOS/ESD Symposium 1995, 1.4.1–1.4.7, pp 27–33. FIG. 4 of said publication shows a punch-through diode with a mesa having an npn layer structure.

The two n-type layers are provided with a connection conductor across which, during operation of the diode, a voltage is applied. In this diode, one of the two pn-junctions is in the forward direction while the other pn junction is in the reverse direction. The thickness and the doping concentration of the p-type region are chosen so that this region is depleted during operation.

The drawback of the known device resides in that it carries a high current already at a voltage below the operating voltage, which is undesirable. The current at the operating voltage, however, often is lower than desirable.

SUMMARY OF THE INVENTION

Therefore, it is an object of the invention to provide a device which does not have the above drawback and which, consequently, carries a low current at a voltage below the (maximum) operating voltage, and which preferably carries a current which is as high as possible at a voltage equal to the operating voltage. The diode which meets these requirements should additionally be easy to manufacture.

To achieve this, a device of the type mentioned in the opening paragraph is characterized in that a part of the second semiconductor region, which, viewed in projection, adjoins the edge of the mesa, is provided with a flux of doping atoms of the second conductivity type, which is greater than that in the rest of the second semiconductor region. It has been found that, in any case, such a diode carries a relatively low current at a voltage below the operating voltage. The invention is first of all based on the recognition that the relatively high current which the known diode carries at a voltage below the operating voltage can be attributed to the fact that in this diode the punch-through situation locally already occurs at a voltage below the operating voltage while it should occur at the same time everywhere. Further analysis has revealed that the punch-through situation occurs first near the edge of the mesa. The invention is further based on the recognition that by increasing the flux of the doping atoms of the second semiconductor region, it is achieved that punch-through at the edge of the diode occurs at a later time. The reason for this being that increasing the flux of doping atoms in the second semiconductor region means increasing either the doping concentration or the thickness of said region. As a result of each one of the two measures, the depletion layer of the one pn-junction formed by the second semiconductor region does not reach the other pn-junction formed by the second semiconductor region until a higher voltage level has been reached. An increase of the doping concentration leads to a more rapid decrease of the electric field in the second semiconductor region, which implies that only at a higher voltage complete depletion is achieved. The same effect is achieved by increasing the thickness of the second semiconductor region.

Both measures can of course be taken simultaneously, however, only one of them is necessary. Even if, for example, the thickness is sufficiently increased while, at the same time, the doping concentration is reduced, the situation of punch-through can still be postponed to a later time. However, this reduction should not be so strong that it completely annihilates the positive effect of a larger thickness. A similar situation occurs with respect to the thickness when it has been decided to increase the doping concentration. Preferably, in a device in accordance with the invention, the thickness of the second semiconductor region is increased locally, near the edge of the mesa. This does not only yield the best results but it also results in a diode which can be readily manufactured.

This can be attributed to the fact that the desired effect is obtained in a simple manner by carrying out an ion implantation of doping atoms of the second conductivity type in the first semiconductor region near the edge of the mesa (to be formed). As a result, the risk that the properties of the second and third semiconductor regions, which are preferably very thin, as will become apparent later on in the text, might possibly be influenced is minimal. The reason for this being that said ion implantation can be readily carried out prior to the formation of the second and third semiconductor regions. Said regions may preferably be formed, for example, by means of epitaxy.

Further analyses show that, particularly when the device is used as a camel diode, the best results are obtained if the doping concentrations in the device demonstrate an asymmetric structure. The doping concentration of the third semiconductor region should be much higher than the doping concentration in the first semiconductor region. The same applies to the doping concentration in the second semiconductor region. These measures lead to a diode having excellent self-aligning properties. By virtue of a low barrier, such a device can very suitably be used to carry very high current densities. Suitable doping concentrations for the first, second and third semiconductor regions preferably range from, respectively, $10^{14}$ to $10^{15}$ at/cm$^3$, $10^{17}$ to $10^{19}$ at/cm$^3$ and $10^{19}$ to $10^{20}$ at/cm$^3$, and amount to, for example, respectively $10^{15}$, $5 \times 10^{17}$ and $10^{19}$ at/cm$^3$.

A method of manufacturing a semiconductor device, wherein a semiconductor body which includes a substrate is formed and provided with a mesa within which a stack is formed of a first semiconductor region of a first conductivity type, a second semiconductor region of a second conductivity type, opposite to the first conductivity type, and a third semiconductor region of the first conductivity type, the first and the third semiconductor regions being provided with an electrical connection conductor across which, during operation, an electric voltage is applied, and the thickness and the doping concentration of the second semiconductor region being chosen such that, during operation, the second semiconductor region is fully depleted, characterized in that a part of the second semiconductor region, which, viewed in projection, adjoins the edge of the mesa, is provided with a flux of doping atoms of the second conductivity type, which is greater than that in the rest of the second semiconductor region. Preferably, the thickness of the part of the second semiconductor region adjoining the edge of the mesa is increased.

In a preferred embodiment of a method in accordance with the invention, the part of the second semiconductor region adjoining the edge of the mesa is increased in thickness by providing, in situ, a part of the first semiconductor region adjoining the second semiconductor region with the second conductivity type by means of an ion implantation. Preferably, the (remaining part of the) second semiconductor region and the third semiconductor region are provided by means of epitaxy. The same applies to the first semiconductor region which may however be (much) thicker, for example several micrometers, than the second and the third semiconductor region, which preferably have a thickness of several tens of nanometers. The (local) increase in thickness of the second semiconductor region may be carried out as described hereinabove, while the second and third semiconductor regions, which are more vulnerable on account of their small thickness, have not been formed yet.

These and other aspects of the invention will be apparent from and elucidated with reference to the embodiments described hereinafter.

BRIEF DESCRIPTION OF THE DRAWING

In the drawings.

The Figures are not drawn to scale and, in particular, the dimensions in the thickness direction are exaggerated strongly for clarity. Corresponding regions are referred to by the same reference numeral, whenever possible, and regions of the same conductivity type generally have the same hatching.

DESCRIPTION OF THE PREFERRED EMBODIMENTS

Figure 1:
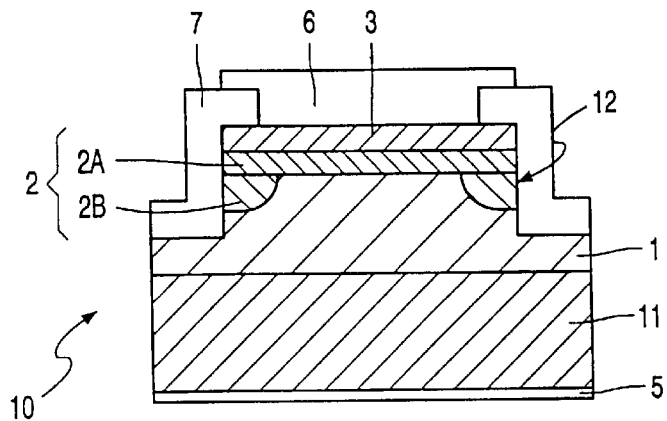
FIG. 1 is a diagrammatic, cross-sectional view, at right angles to the thickness direction, of a semiconductor device in accordance with the invention.

FIG. 1 is a diagrammatic, cross-sectional view, at right angles to the thickness direction, of a semiconductor device in accordance with the invention. The device, which is a so-called punch-through diode, comprises a semiconductor body 10 having a semiconductor substrate 11, here of the n-type, on which a stack is formed of a first semiconductor region 1 of a first conductivity type, here the n-type, a second semiconductor region 2 of a second conductivity type opposite to the first conductivity type, i.e. here the p-type, and a third semiconductor region 3 of the second conductivity type, i.e. here the n-type. The surface of the semiconductor body 10 is provided with a mesa 12 which comprises a part of the first semiconductor region and the entire second and third semiconductor regions (1, 2, 3). The first semiconductor region 1 is provided with a connection conductor 6 via the substrate 11, while a connection conductor 5 is provided on the third semiconductor region 3. During operation, a voltage can thus be applied to the diode. The thickness and the doping concentration of the second semiconductor region are chosen such that, during operation, the second semiconductor region is completely depleted, from which the diode takes its name (punch-through).

According to the invention, in the device, the second semiconductor region 2A, 2B is provided with a flux of doping atoms of the second conductivity type, here the p-type, near the edge of the mesa 12, which is larger than in the center 2A of the second semiconductor region 2. It has been found that a diode of said construction carries a much lower current than the known diode at a voltage which is lower than the operating voltage. The invention is based on the recognition that the relatively high current carried by the known diode at a voltage below the operating voltage is caused by the fact that in this diode the punch-through situation locally already occurs at a voltage which is lower than the operating voltage, while it should occur at the same time everywhere. Further investigation has taught that the punch-through situation occurs first near the edge of the mesa 12. The invention is further based on the recognition that by increasing the flux of the doping atoms of the second semiconductor region 2 near the edge of the mesa 12, the occurrence of punch-through is delayed at said location. The reason for this being that an increase of the flux of doping atoms in the second semiconductor region 2 means either increasing the doping concentration or the thickness of said region 2. As a result of each one of the two measures, the depletion layer of the one pn-junction adjoining the second semiconductor region 2 does not reach the other pn-junction adjoining the second semiconductor region 2 until a higher voltage level has been reached. An increase of the doping concentration leads to a more rapid decrease of the electric field in the second semiconductor region 2, which implies that complete depletion is attained only at a higher voltage. The same effect is achieved by increasing the thickness of the second semiconductor region 2.

In this example, the thickness of the part 2A, 2B of the second semiconductor region 2 adjoining the edge of the mesa 12 is increased. By virtue thereof, excellent results are achieved and the manufacture of the device, as will be explained hereinbelow, is very simple.

In this example, the structure of the doping concentrations of the first, second and third semiconductor regions 1, 2, 3 is chosen to be asymmetric. Both the doping concentration of the second semiconductor region 2 and the doping concentration of the third semiconductor region 3 are much higher than that of the first semiconductor region 1. Research has revealed that a more symmetrical structure results in a device having substantially no self-aligning properties, i.e. irrespective of the polarity of the voltage applied, a large current runs through the device, which is undesirable. Doping concentrations which proved to be suitable for the first, second and third semiconductor regions 1, 2, 3, vary, respectively, from $10^{14}$ to $10^{15}$ at/cm$^3$, from $10^{17}$ to $10^{19}$ at/cm$^3$ and from $10^{19}$ to $10^{20}$ at/cm$^3$. In this example, said doping concentrations are, respectively, $1\times10^{15}$, $1.8\times10^{18}$ and $1\times10^{19}$ at/cm$^3$. In this case, the thickness of said regions is, respectively, 9 μm, 40 nm and 200 nm. Near the edge of the mesa 12, the thickness of the second semiconductor region is increased to approximately 1 μm, which can be attributed to the presence of the part 2B of the second semiconductor region 2, which part is recessed in the first semiconductor region 1, and which has a thickness of approximately 0.4 μm after implantation, and of approximately 1 μm after a subsequent diffusion.

The substrate 11 has a thickness of 600 μm and a specific resistance of 0.007 mΩcm or less. In this example, the mesa 12 is square and has a surface area of 11,900 μm$^2$, and a height of 2.4 μm, the mesa being covered with a 400 nm thick insulating layer 7 which, in this case, includes silicon dioxide. Both connection conductors 5, 6 comprise 10 nm AlSi, 100 nm TiW(N) and 0.5 μm Al. The dimensions of the semiconductor body 10 are approximately 100 μm larger than those of the mesa 12.

Figure 2:
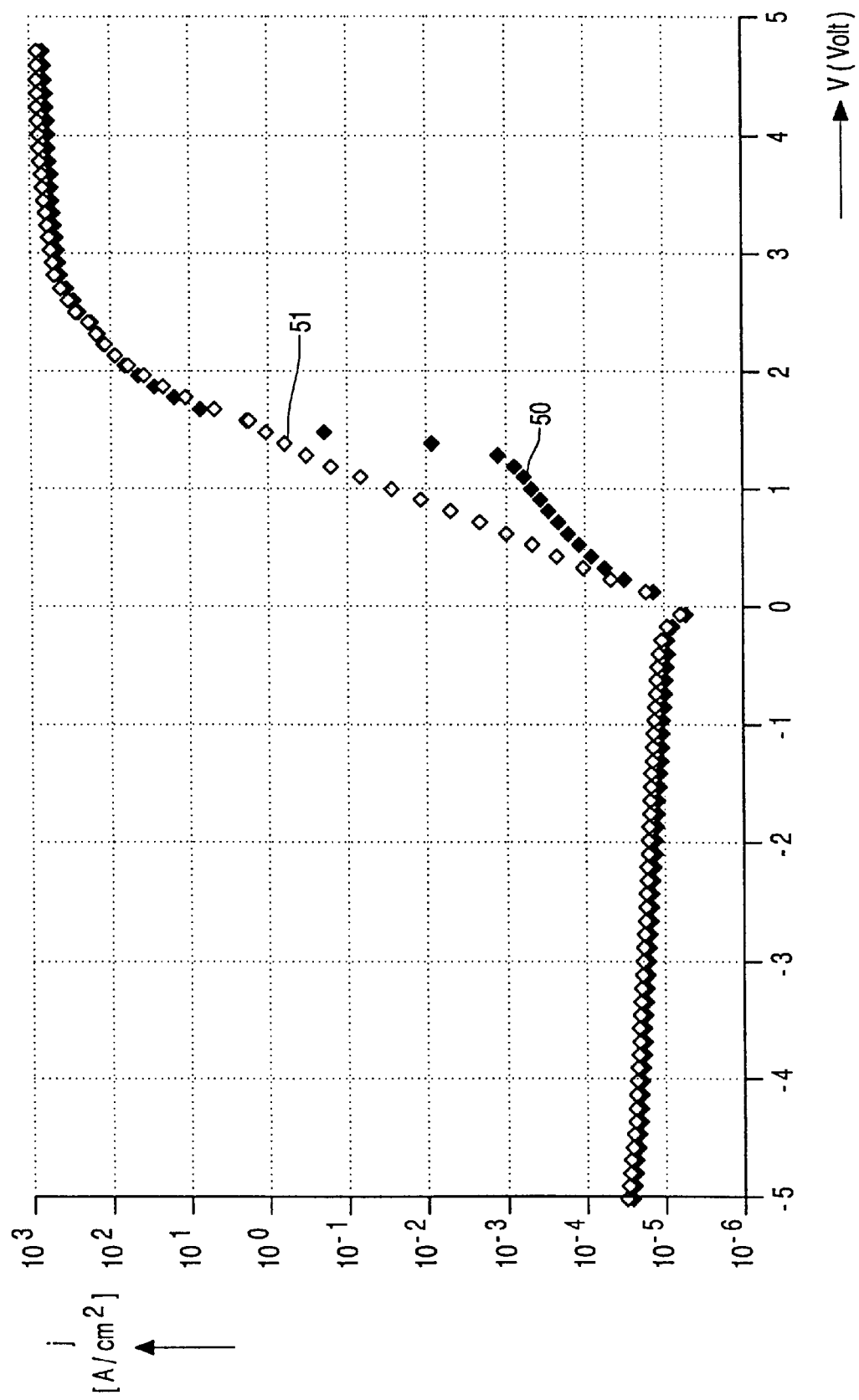
FIG. 2 shows the current-voltage characteristic of a device in accordance with the invention, and, for comparison, the current-voltage characteristic of a conventional diode.

FIG. 2 shows the current-voltage characteristic (curve 50) of a device in accordance with the invention. For comparison, curve 51 shows the current-voltage characteristic of a conventional device. Unlike the device in accordance with the invention (see FIG. 1), said conventional device does not comprise the thickened portion 2B of the second semiconductor region 2 near the edge of the mesa 12. The device in accordance with the invention (curve 50) shows that punch-through occurs at approximately 1.5 V and that at a voltage below 1.5 V only a relatively small leakage current flows through the diode. The conventional diode (curve 51), on the other hand, shows impermissibly high leakage currents also at voltages below the punch-through voltage. This clearly illustrates the importance of the invention.

Figure 3:
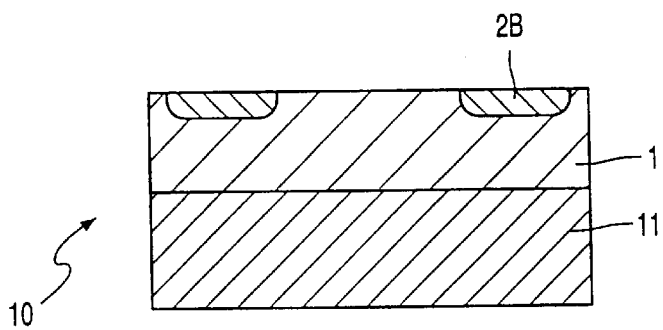
FIGS. 3 through 5 are diagrammatic, cross-sectional views, at right angles to the thickness direction, of the device shown in FIG. 1, in successive phases in the manufacture using a method in accordance with the invention.
Figure 4:
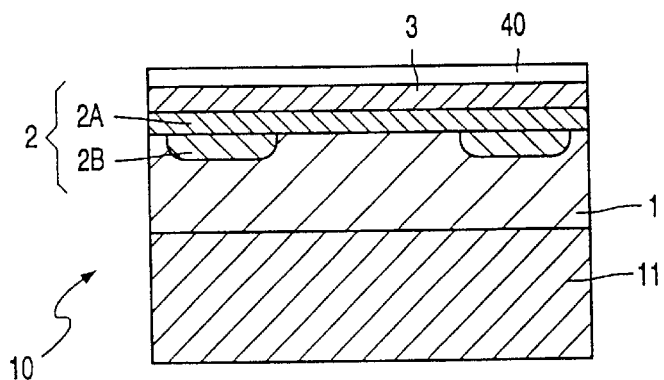
Figure 5:
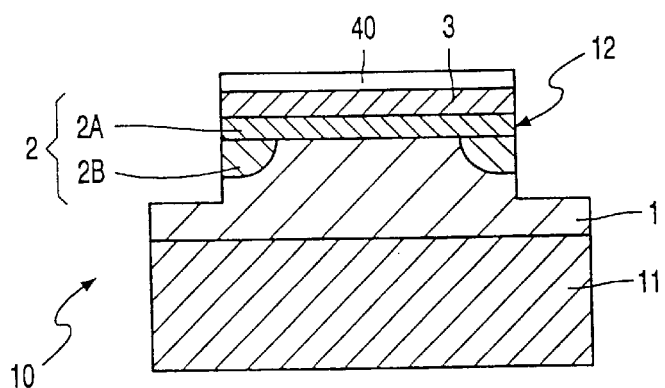

FIGS. 3 through 5 are diagrammatic, cross-sectional views, at right angles to the thickness direction, of the device shown in FIG. 1 in successive phases in the manufacture using a method in accordance with the invention. There is started from (see FIG. 3) an n-type Si substrate 11. On said substrate 11 there is formed a first semiconductor region 1 by applying an epitaxial layer 1 of n-type silicon, in this case by means of non-selective gas-phase epitaxy at a temperature of 1050° C. Subsequently, a mask is provided (not shown in the Figure), and a part 2B of a second semiconductor region 2 is formed of p-type Si, in this case by means of ion implantation, which part 2B is recessed in the first semiconductor region 1. In this example, boron ions are implanted at an implantation energy of 40 keV and a flux of $4 \times 10^{14}$ at/cm$^2$. Subsequently, the semiconductor body 10 is tempered at a temperature of 1050° C. in an N$_2$ atmosphere.

Subsequently, (see FIG. 4), on the semiconductor body 10 shown in FIG. 3, the remaining part 2A of the second semiconductor region 2 is formed by applying a p-type epitaxial layer 2A of Si. In this case, however, epitaxial growth takes place at a low temperature of 700° C. In the same way, a third semiconductor region 3 is provided in the form of an n-type epitaxial layer 3 of Si. Subsequently, a mask layer 40, for example of silicon dioxide, is provided and (see FIG. 5) patterned. Next, a mesa 12 is formed by means of etching, here use is made of a plasma-etch technique. Finally, the mesa 12 is covered with a passivating layer 7, in this case of silicon dioxide, which is applied by means of PECVD (=Plasma Enhanced Chemical Vapor Deposition) in a thickness of 400 nm. By means of photolithography and etching, a contact opening is formed on top of the mesa 12 in the passivating layer 7, and, after two-sided metallization 5, 6 as indicated hereinabove, the device in accordance with the invention is ready for final assembly.

The invention is not limited to the example given herein because, within the scope of the invention, many modifications and variations are possible to those skilled in the art. For example, other thicknesses, other (semiconductor) materials or other compositions than those mentioned in the example may be used. It is also possible to simultaneously replace all conductivity types with the opposite conductivity types. It is noted in particular that the local thickening of the second semiconductor region at the edge of the mesa may alternatively be present on two sides of the second semiconductor region instead of one (the upper side or the lower side). In the former case, for example, the entire side face of the mesa may be provided with doping atoms of the second conductivity type, for example by means of an implantation or by means of diffusion.

Various process steps which are not relevant to the invention may also be carried out differently, for example, an oxide layer obtained by plasma deposition may alternatively be formed by deposition from the gas phase.

Finally, it is noted that the application of the device and the method in accordance with the invention is not limited to discrete devices. Other (semiconductor) components can be integrated in the semiconductor body.

What is claimed is:

1. A semiconductor device comprising a semiconductor body (10) which includes a substrate (11) and is provided with a mesa (12), said semiconductor body comprising, in succession, a first semiconductor region (1) of a first conductivity type, a second semiconductor region (2) of a second conductivity type, opposite to the first conductivity type, and a third semiconductor region (3) of the first conductivity type, the first and the third semiconductor regions (1, 3) being provided with an electrical connection conductor (5, 6) across which, during operation of the device, an electric voltage is applied, and the thickness and the doping concentration of the second semiconductor region (2) being chosen such that, during operation, the second semiconductor region (2) is fully depleted, characterized in that a part (2A, 2B) of the second semiconductor region (2), which, viewed in projection, adjoins the edge of the mesa (12) but does not extend laterally beyond the edge of the mesa (12) or vertically below the mesa, is provided with a flux of doping atoms of the second conductivity type which is greater than that in the rest (2A) of the second semiconductor region (2).

2. A semiconductor device as claimed in claim 1, characterized in that the part (2A, 2B) of the second semiconductor region (2) adjoining the edge of the mesa (12) has a thickness which is larger than that of the rest (2A) of the second semiconductor region (2).

3. A semiconductor device as claimed in claim 1, characterized in that the part (2A, 2B) of the second semiconductor region (2) adjoining the edge of the mesa (12) is partly (2B) recessed in the first semiconductor region (1).

4. A semiconductor device as claimed in claim 1, characterized in that the doping concentrations of the second and the third semiconductor region (2, 3) are much higher than the doping concentrations of the first semiconductor region (1).

5. A semiconductor device as claimed in claim 1, characterized in that the doping concentration of the first semiconductor region (1) ranges between $10^{14}$ and $10^{17}$ at/cm$^3$, the doping concentration of the second semiconductor region (2) range, between $10^{17}$ and $10^{19}$ at/cm$^3$, and the doping concentration of the third semiconductor region (3) ranges between $10^{19}$ and $10^{20}$ at/cm$^3$.

6. A semiconductor device as claimed in claim 1, characterized in that the mesa (12) comprises the second and the third semiconductor region (2, 3), and only a part of the first semiconductor region (1) and the side faces of the mesa (12) are covered with an insulating layer (7).

7. A semiconductor device as claimed in claim 1, where said part of the second semiconductor region is not utilized to convert electron current into hole current or hole current into electron current, for injection into said second semiconductor region.

8. A semiconductor device as claimed in claim 7, where said electron current or hole current, prior to said conversion, is generated in an adjacent transistor.

9. A method of manufacturing a semiconductor device, wherein a semiconductor body (10) with a substrate region (1) of a first conductivity type, a second semiconductor region (2) of a second conductivity type, which is opposite to the first conductivity type, and a third semiconductor region (3) of the first conductivity type, the first and the third semiconductor (5, 6) across which, during operation of the device, an electric voltage is applied, and the thickness and the doping concentration of the second semiconductor region (2) being chosen such that, during operation, the second semiconductor region (2) is fully depleted, characterized in that a part (2A, 2B) of the second semiconductor region (2) which, viewed in projection, adjoins the edge of the mesa (12) but does not laterally extend beyond the edge of the mesa (12) or vertically below the mesa is provided with a flux of doping atoms of the second conductivity type which is larger than that in the rest (2A) of the second semiconductor region (2).

10. A method as claimed in claim 9, characterized in that the part (2A, 2B) of the second semiconductor region (2) adjoining the edge of the mesa (12) is provided with a larger thickness.

11. A method as claimed in claim 10, characterized in that the part (2A, 2B) of the second semiconductor region (2) adjoining the edge of the mesa (12) is increased in thickness by providing, in situ, a part (2B) of the first semiconductor region (1) adjoining the second semiconductor region (2) with the second conductivity type by means of an ion implantation.

12. A method as claimed in claim 9, characterized in that the first semiconductor region (1), the second and the third semiconductor region (2, 3) are formed by providing successively a first epitaxial layer (1) of the first conductivity type, a second epitaxial layer (2A) of the second conductivity type and a third epitaxial layer (3) of the first conductivity type onto the substrate (11).

13. A semiconductor device comprising:
a semiconductor body (10) which includes a substrate (11) and is provided with a mesa (12), said semiconductor body comprising, in succession,
a first semiconductor region (1) of a first conductivity type,
a second semiconductor region (2) of a second conductivity type, opposite to the first conductivity type, and
a third semiconductor region (3) of the first conductivity type,
the first and the third semiconductor regions (1, 3) being provided with an electrical connection conductor (5, 6) across which, during operation of the device, an electric voltage is applied, and
the thickness and the doping concentration of the second semiconductor region (2) being chosen such that, during operation, the second semiconductor region (2) is fully depleted,
characterized in that a part (2A, 2B) of the second semiconductor region (2), which, when viewed in projection, adjoins the edge of the mesa (12), is provided with a flux of doping atoms of the second conductivity type which is greater than that in the rest (2A) of the second semiconductor region (2), characterized in that a part of the second semiconductor region, which, when viewed in projection, adjoins the edge of the mesa but does not extend laterally beyond the edge of the mesa or vertically below the mesa.

* * * * *

UNITED STATES PATENT AND TRADEMARK OFFICE
CERTIFICATE OF CORRECTION

PATENT NO.    : 6,459,133 B1  
DATED         : October 1, 2002  
INVENTOR(S)   : Adam R. Brown et al.

It is certified that error appears in the above-identified patent and that said Letters Patent is hereby corrected as shown below:

<u>Title page,</u>
Item [73], Assignee, change "Phillips" to -- Philips --.

Signed and Sealed this

Twenty-second Day of July, 2003

JAMES E. ROGAN
*Director of the United States Patent and Trademark Office*